United States Patent [19]

Ueda et al.

[11] Patent Number: 5,103,115
[45] Date of Patent: Apr. 7, 1992

[54] POWER-ON RESET CIRCUIT

[75] Inventors: Yutaka Ueda; Nobuaki Miyakawa, both of Kanagawa, Japan

[73] Assignee: Fuji Xerox Co., Ltd., Tokyo, Japan

[21] Appl. No.: 732,179

[22] Filed: Jul. 18, 1991

[30] Foreign Application Priority Data

Jul. 19, 1990 [JP] Japan .................................. 2-191012

[51] Int. Cl.⁵ .................................................. H03K 5/153
[52] U.S. Cl. .............................. 307/272.3; 307/296.4; 307/296.5; 307/592
[58] Field of Search ...................... 307/272.3, 592, 594, 307/597, 296.4, 296.5

[56] References Cited

U.S. PATENT DOCUMENTS 4,900,950  2/1990  Dubujet ............................ 307/272.3
4,948,995  8/1990  Takahashi ........................ 307/296.5
4,970,408  11/1990  Hanke et al. ..................... 307/272.3
5,039,875  8/1991  Chang ............................... 307/272.3

Primary Examiner—Stanley D. Miller
Assistant Examiner—Scott A. Ouellete
Attorney, Agent, or Firm—Finnegan, Henderson, Farabow, Garrett & Dunner

[57] ABSTRACT

A power-on reset circuit including a constant voltage circuit element in which a voltage drop is limited to within a fixed value, a transistor to which a source voltage is applied from the constant voltage circuit element and a gate voltage is applied from a power source voltage to be monitored, a current path forming element, connected to the drain of the transistor, fed with current from a power source voltage, and an invertor an input terminal of which is connected to a node of the current path forming element and the transistor.

6 Claims, 4 Drawing Sheets

POWER-ON RESET CIRCUIT

BACKGROUND OF THE INVENTION

The present invention relates to a power-on reset circuit for monitoring a variation of a power source voltage applied to a digital circuit or the like.

Circuit elements, such as transistors, forming a digital circuit or the like would improperly operate when the power source voltage applied thereto drops below a preset value. Such a drop causes many serious problems. For example, incorrect data is stored, the stored data is destroyed, and an error signal is applied to related circuits.

A power-on reset circuit has been employed in order to avoid the situations involving such problems. The power-on reset circuit operates as follows. The power-on reset circuit continuously monitors a power source voltage. When a power source voltage exceeds a predetermined value, the power-on reset circuit allows a digital circuit to start operating. When the power source voltage drops to below the predetermined value, the power-on reset circuit immediately quits the operation of the digital circuit, and moves the necessary data to safe places.

FIG. 7 is a circuit diagram showing a conventional power-on reset circuit. The conventional power-on reset circuit shown in FIG. 7 includes a resistor 1, a capacitor 2, an invertor 3, a node 4, an output terminal 5, a power voltage terminal 13, a substrate 14, a power voltage $V_{DD}$, and a substrate voltage $V_{SS}$. For ease of explanation, $V_{SS}$ is set at 0 V, $V_{SS} = 0$ V in the following description of the invention.

The node 4 is a connection point between a line connecting the resistor 1 to the capacitor 2, and a line connecting to the input of the invertor 3. The resistor 1 and the capacitor 2 constitute a time constant circuit.

FIG. 8 is a graph showing an operation of the power-on reset circuit illustrated in FIG. 7. In the graph, the abscissa represents time T, and the ordinate voltage V. The power voltage $V_{DD}$, voltage V4 at the node 4, and voltage V5 as an output voltage of the invertor 3, vary as shown in FIG. 8. $V_{IV}$ represents an input threshold voltage of the invertor 3. A logical state of the invertor 3 is inverted at the threshold value $V_{IV}$.

When the power voltage $V_{DD}$ is applied to the invertor 3, the voltage V4 rises along a curve defined by a time constant constituted by the resistor 1 and the capacitor 2. The output voltage V5 of the invertor 3 is kept in logical high before time point t1 at which the voltage V4 reaches the threshold voltage $V_{IV}$. When the voltage V4 reaches the threshold voltage $V_{IV}$, the output voltage is inverted to be low in logical state. The high-to-low change of the output voltage of the invertor 3 indicates that the power source voltage has risen up to a predetermined value, and hence the digital circuit will operate normally.

Unexamined Japanese Patent Application (OPI) No. Sho. 56-68027, for example is enumerated for articles describing the conventional power-on reset circuit.

The power-on reset circuit as mentioned above suffers from the problems as stated in the following. The first problem is that a large space is required for constructing the time constant circuit. The second problem is that it takes a relatively long time to detect a change of the power voltage after it actually changes, and further that an interruption (simultaneous stoppage) cannot be detected if occurring in the power source. The third problem is that it is very difficult to obtain an optimum time constant characteristic of the time constant circuit. The reason for the third problem is that the time constant circuit is constituted by the resistor and the capacitor and hence its characteristic is influenced by the variation in the values of those components.

The first and second problems will be described more specifically, however, no further description of the third problem is given because it is believed that no particular description is required about the third problem.

With respect to the first problem, the digital circuit designed such that it starts to operate in response to an instruction by the output signal of the power-on reset circuit is generally fabricated into an integrated circuit. For this reason, it is desirable to fabricate also the power-on reset circuit as an integrated circuit on a semiconductor substrate. The resistor and capacitor, when fabricated, requires large areas than the transistors.

Concerning the second problem, the voltage V4 takes a relatively long time until it reaches the threshold voltage value of the invertor 3. Therefore, the power-on reset circuit sometimes fails to detect an interruption, if it occurs.

For example, now assuming that the power voltage is interrupted at time point t2 and restored to the normal voltage at time point t3 as illustrated in FIG. 8, in this case, the voltage V4 begins to drop at time point t2 according to the time constant. The power voltage restores to the normal voltage before it drops to reach the threshold voltage $V_{IV}$ of the invertor 3, so that it increases again according to the time constant. Accordingly, the output voltage of the invertor 3 remains unchanged. Thus, the power-on reset circuit fails to detect the variation of the power voltage due to the interruption.

SUMMARY OF THE INVENTION

In view of the problems accompanied in the conventional device, it is an object of the present invention to provide a power-on reset circuit which requires a small space constructing the time constant circuit.

It is another object of the invention to provide a power-on reset circuit in which it takes a short time to detect a change of the power voltage after it actually changes.

It is still another object of the invention to provide a power-on reset circuit capable of obtaining an optimum time constant characteristic of the time constant circuit.

The above and other objects of the invention have been achieved by a provision of a power-on reset circuit which, according to the present invention, comprises a constant voltage circuit element in which a voltage drop is limited to within a fixed value, a transistor to which a source voltage is applied from the constant voltage circuit element and a gate voltage is applied from a power source voltage to be monitored, a current path forming element, connected to the drain of the transistor, fed with current from a power source voltage, and an invertor in which an input terminal is connected to a node of the current path forming element and the transistor.

In actually designing the power-on reset circuit as just mentioned, the power-on reset circuit may comprise: an invertor; a first N-channel enhancement type transistor in which the source is connected to a substrate, and the gate and drain are connected together; a second N-channel enhancement type transistor in which the source is connected to the drain of the first N-channel enhancement type transistor, the gate is connected to the terminal of the monitored power source voltage, and the drain is connected to the input terminal of the invertor; and a P-channel enhancement type transistor in which the drain is connected to the input terminal of the invertor, the source is connected to the terminal, and the gate is connected to a substrate.

According to another arrangement of the invention, the power-on reset circuit may comprise: an invertor; a first N-channel enhancement type transistor in which the source is connected to a substrate, and the gate and drain are connected together; a second N-channel enhancement type transistor in which the source is connected to the drain of the first N-channel enhancement type transistor, the gate is connected to the terminal of the monitored power source voltage, and the drain is connected to the input terminal of the invertor; and a N-channel depletion type transistor in which the drain is connected to the terminal, and the gate and source are connected to the input terminal of the invertor.

Current is supplied from the power source through the current forming element to the transistor in which the gate voltage of which is applied from a power source voltage to be monitored.

At the initial stage of the conduction of the transistor, the constant voltage circuit element applies the voltage rising with the rising of the power voltage to the source of the transistor. Therefore, the conduction of the transistor little changes because even if the gate voltage of the transistor rises up, the source voltage rises following the increase of the gate voltage.

When the rising of the power voltage continues and the voltage reaches a constant voltage, the rise of the source voltage stops. Subsequently, the power voltage rise increases the gate-source voltage, so that the conduction of the transistor increases.

As a result, the drain voltage of the transistor (viz., the input voltage of the invertor) drops below the threshold value of the invertor. Therefore, the power-on reset circuit can detect a voltage which exceeds the threshold value.

The operation of the power-on reset circuit when the power voltage drops is performed in the reverse order.

DESCRIPTION OF THE PREFERRED EMBODIMENTS

Preferred embodiments of the present invention will now be described with reference to the accompanying drawings.

Figure 1:
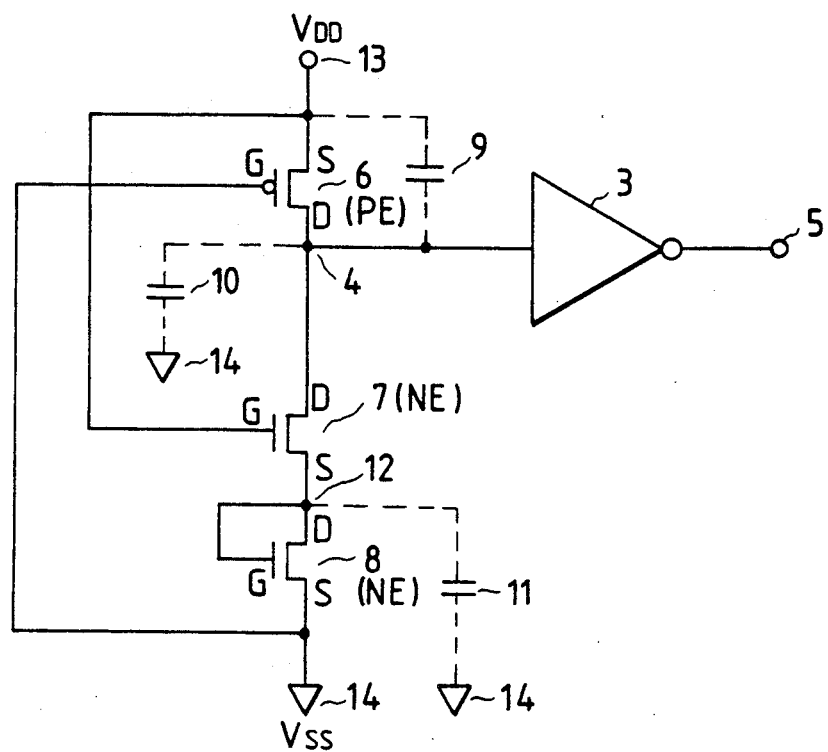
FIG. 1 is a circuit diagram of a power-on reset circuit according to a first embodiment of the present invention.
Figure 7:
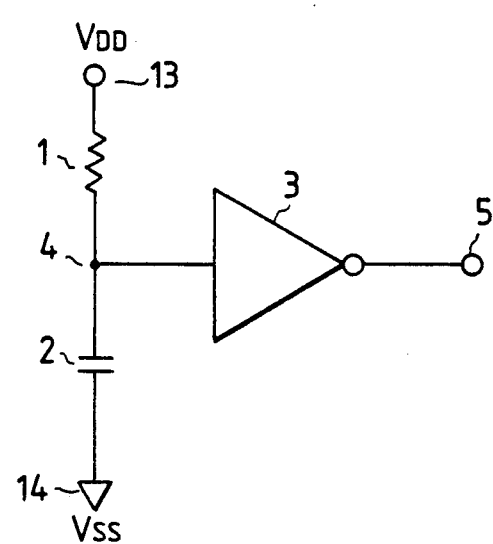
FIG. 7 is a circuit diagram showing a conventional power-on reset circuit.

FIG. 1 is a circuit diagram of a power-on reset circuit according to a first embodiment of the present invention. In FIG. 1, like reference symbols and numerals are used for designating like or equivalent portions in FIG. 7.

The power-on reset circuit according to the first embodiment of the invention is provided with a P-channel enhancement (PE) type transistor 6, N-channel enhancement (NE) type transistors 7 and 8, stray capacitances 9, 10 and 11, a node 12, a power voltage terminal 13, and a substrate 14. The transistors shown in FIG. 1 have equal threshold values $V_{TH}$.

The source S and the drain D of the transistor 6 are connected to the power source voltage terminal 13 and the drain D of the transistor 7, respectively. The gate G of the transistor 6 is connected to the substrate 14. The gate G and the source S of the transistor 7 are connected to the power source voltage terminal 13 and the drain D of the transistor 8, respectively. On the other hand, the gate G of the transistor 8 is connected to a drain D thereof, so that the transistor 8 operates in the diode mode. The source S of the transistor 8 is connected to the substrate 14. The node 4 connecting between the drains of the transistors 6 and 7 is connected to an input of the invertor 3.

The state of the power voltage $V_{DD}$ can be detected from a signal derived from the output terminal 5.

The operation of the FIG. 1 circuit will be described with reference to FIGS. 2 to 5.

Figure 2:
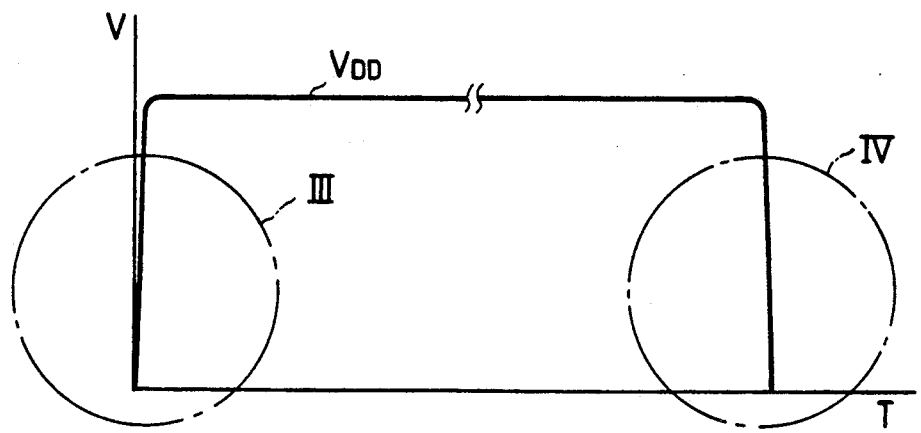
FIG. 2 is a graph showing a variation of the power voltage during the period of time between the power on and the power off.

FIG. 2 is a graph showing a variation of the power voltage during the period of time between the power on and the power off. In the figure, III and IV indicate rise and fall portions of the voltage waveform, the enlarged views of which are illustrated in FIGS. 3 and 4, respectively.

Figure 3:
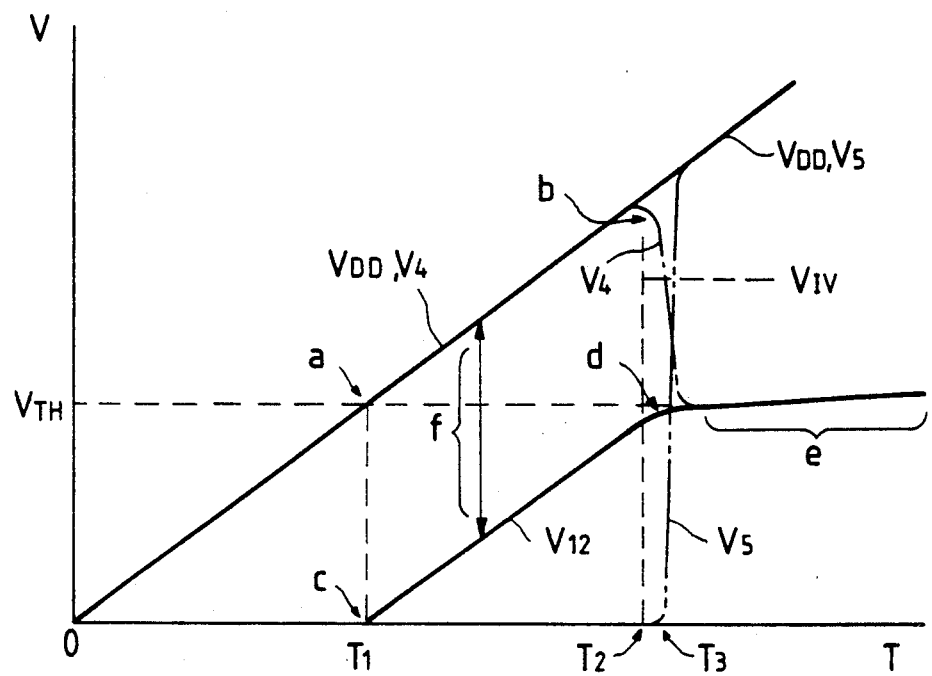
FIG. 3 is a graph for explaining the operation of the FIG. 1 circuit when the power voltage rises.
Figure 4:
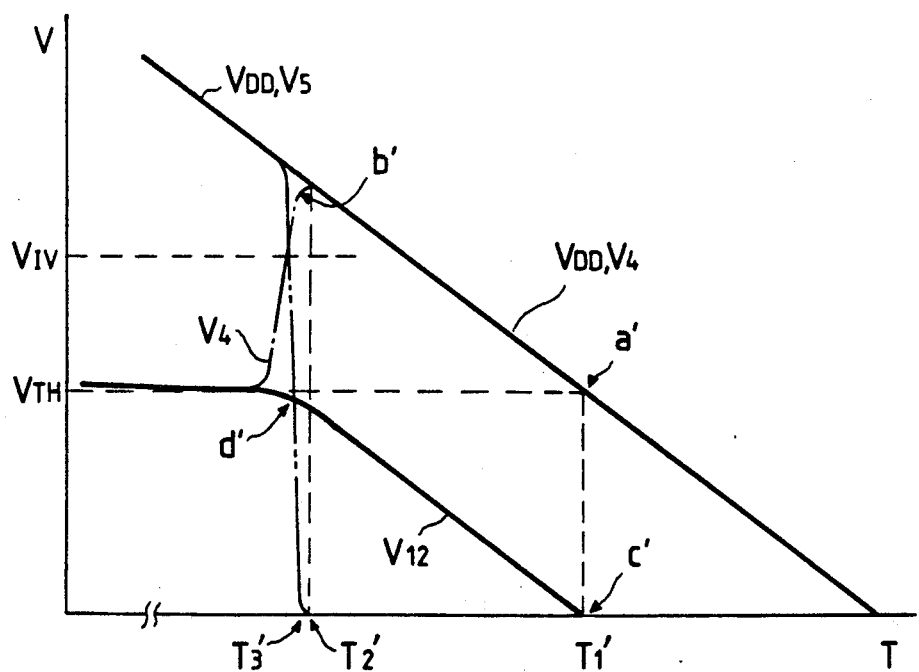
FIG. 4 is a graph for explaining the operation of the FIG. 1 circuit when the power voltage falls.

FIG. 3 is an enlarged view of the rise portion of the power voltage shown in FIG. 1 and shows the operation of the circuit when the power voltage rises. For ease of explanation, the illustration is enlarged in the time axis (abscissa) direction.

Description of the operation will be given with the rising of the power voltage $V_{DD}$.

(1) Time period before the gate-source voltage of each of the transistors 6 and 7 reaches the threshold voltage $V_{TH}$ (from time point 0 to time point T1 in FIG. 3) (as already described, the threshold voltages of both the transistors are equal to each other):

During this time period, those transistors are not rendered conductive for the following reasons.

The power voltage $V_{DD}$ is applied between the source S and the gate G of the transistor 6, and therefore, the gatesource voltage of the transistor 6 is $V_{DD}$. Voltage at the node 12 connected to the source S of the transistor 7 is at the substrate voltage $V_{SS}$ (zero) at the initial stage. On the other hand, since the power voltage $V_{DD}$ is applied to the gate G of the transistor 7, the gate-source voltage of the transistor 7 is also $V_{DD}$. The gate-source voltages of those transistors 6 and 7 do not yet reach the threshold voltage $V_{TH}$, and therefore both transistors are not conductive. Further, since the transistor 8 is connected at the gate G thereof to the node 12, it will not be conductive until the transistor 12 becomes conductive and the voltage at the node 12 rises.

Voltage is transferred to the node 4, through a stray capacitance present between the power source voltage terminal 13 and the node 4. Therefore, the voltage V4 rises with the rise of the power voltage $V_{DD}$.

(2) Time period ranging from an instant that the gate-source voltages of the transistors 6 and 7 reach the threshold voltage $V_{TH}$ to a time point immediately before the gate-source voltage of the transistor 8 reaches the threshold voltage $V_{TH}$ (between time points T1 and T2 in FIG. 3):

When the gate-source voltages of the transistors 6 and 7 reach the threshold voltage $V_{TH}$, those transistors become active conduction. Current flows through those transistors to charge the stray capacitance 11. With the charge, the voltage V12 at the node 12 increases. The voltage rise is illustrated by a segment between time points c and d of the curve V12 shown in FIG. 3.

The rise of the voltage V12 at the node 12 causes about the following two facts.

(i) First, the body effect is caused in the transistor 7. The body effect is such a phenomenon that when the source voltage $V_S$ rises with respect to the substrate voltage $V_{SS}$, the gate voltage $V_G$ which is employed to turn on the transistor also increases. This is because that if the voltage V12 rises with respect to the substrate voltage $V_{SS}$, the source voltage $V_S$ rises with respect to the substrate voltage $V_{SS}$ since the node 12 is connected to the source S of the transistor 7. In this condition, if the source voltage $V_S$ is set at a fixed value, no body effect occurs in the transistor. Accordingly, if the gate voltage $V_G$ rises owing to the rise of the power voltage $V_{DD}$, the gate-source voltage $V_{GS}$ exceeds the threshold voltage, so that a conduction state of the transistor 7 is improved.

When the transistor 7 is in active condition state and current starts to flow, and the source voltage $V_S$ rises, a further rise of the gate voltage $V_G$ is required to keep the same conduction state because of the body effect. In other words, even if the gate voltage $V_G$ is made to rise, if the source voltage $V_S$ correspondingly rises, the gate-source voltage $V_{GS}$ will not rise and hence the conduction state of the transistor remains unchanged. During the period from time point T1 to T2, the transistor 7 operates under such condition.

Thus, when the power voltage $V_{DD}$ rises, the source voltage $V_S$ and the gate voltage $V_G$ of the transistor 7 are made to rise while the difference between them being kept substantially constant (equal to that when the transistors starts its conduction). The substantially constant difference voltage is indicated by f in FIG. 3.

(ii) The second fact brought about by the rise of the voltage V12 at the node 12 is that the transistor 8 is set almost all at a conductive state.

Figure 5:
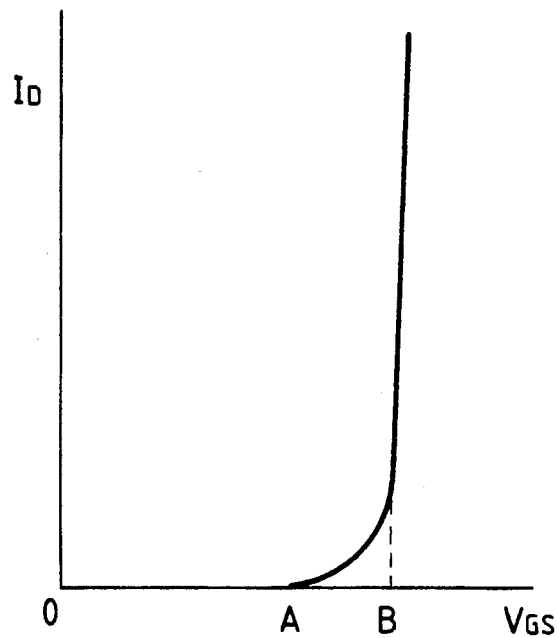
FIG. 5 is a graph showing a voltage vs. current characteristic of the field effect transistor.

A voltage vs. current characteristic of the field effect transistor as used in this instance is shown in FIG. 5. In the graph, the abscissa represents the gate-source voltage $V_{GS}$, and the ordinate the drain current $I_D$. As seen from the characteristic curve, it can be macroscopically considered that the current $I_D$ starts to rapidly rise at a predetermined value of the voltage $V_{GS}$. Microscopically, the current $I_D$ starts to gently rise at point A of the voltage $V_{GS}$, and continues the gentle rise up to point B, and rapidly rises after point B.

The transistor 8 connected in a diode mode also operates according to the characteristic of FIG. 5. In this case, if the voltage V12 at the node 12, the transistor 8 is set almost all at the conductive state.

(3) Period subsequent to the conduction of the transistor 8 (after time point T2 in FIG. 3)

The voltage V12 increases to exceed the value A in FIG. 5, and current starts to flow through the transistor 8. This fact is equivalent to the formation of a by-pass circuit in parallel to the stray capacitance 11 in FIG. 1. With the formation of the by-pass circuit, the increase of voltage V12 caused by the charge of the stray capacitance 11 loses the sharpness of its rise. More specifically, as shown in FIG. 3, the rise of the voltage V12 becomes dull in the vicinity of point d, and thereafter it becomes abruptly sharp. As a result, the voltage V4 at the node 4 also abruptly falls. Point b indicated in FIG. 3 represents a portion where the voltage V4 starts to drop.

If design is made such that when the conduction state of the transistor 7 becomes satisfactorily good, the resistive component between the drain and source is much smaller than that of the transistor 6, the voltage V4 is substantially equal to the voltage V12 (portion e). Thus, the voltage V4 at the node 4 used as the input of the invertor 3 rises with increase of the power voltage $V_{DD}$ in the initial stage, but with progress of its rise, it drops up to the threshold voltage of the transistor 8. Hence, as shown in FIG. 3, the peak of the voltage V4 (voltage value in the portion b in FIG. 3) is set above the threshold voltage $V_{IV}$ of the invertor 3, and the value (voltage value in the vicinity of e) of the voltage when it drops after peaked is set below the threshold voltage $V_{IV}$.

When thus designed, the output voltage V5 of the invertor 3 changes its state from low to high when the voltage V4 drops below the threshold voltage $V_{IV}$. This time is indicated as time point T3 in FIG. 3. In this way, the power on reset circuit can detect that the power voltage $V_{DD}$ is in excess of a predetermined value.

(4) When the power voltage $V_{DD}$ is shut off:

This is the case indicated by IV in FIG. 2. The power voltage falls. FIG. 4 is a graph for explaining the operation of the FIG. 1 circuit when the power voltage falls. In FIG. 4, like reference symbols and numerals designate like portions of FIG. 3, and the primed symbols designate the portions as indicated by like but not primed symbols in FIG. 3. The operation when the power voltage $V_{Dd}$ is shut off progresses in the reverse order of the voltage rise operation, and hence will be outlined.

When the power voltage $V_{DD}$ drops below a stationary value, the conduction state of the transistor 7 becomes low and, accordingly, the voltage V4 increases. At this time, the voltage V4 crosses the threshold voltage $V_{IV}$ to change the output voltage of the invertor 3 from high to low in logic state. The high-to-low change of the output terminal indicates that the drop of the power voltage $V_{DD}$. The drop of the voltage V12 follows the drop of the voltage $V_{DD}$, and the transistor 8 becomes nonconductive. When the voltage $V_{Dd}$ drops below the threshold voltage $V_{TH}$, the transistors 6 and 7 are also turned off.

Another aspect of the present invention will now be described with reference to FIG. 6.

Figure 6:
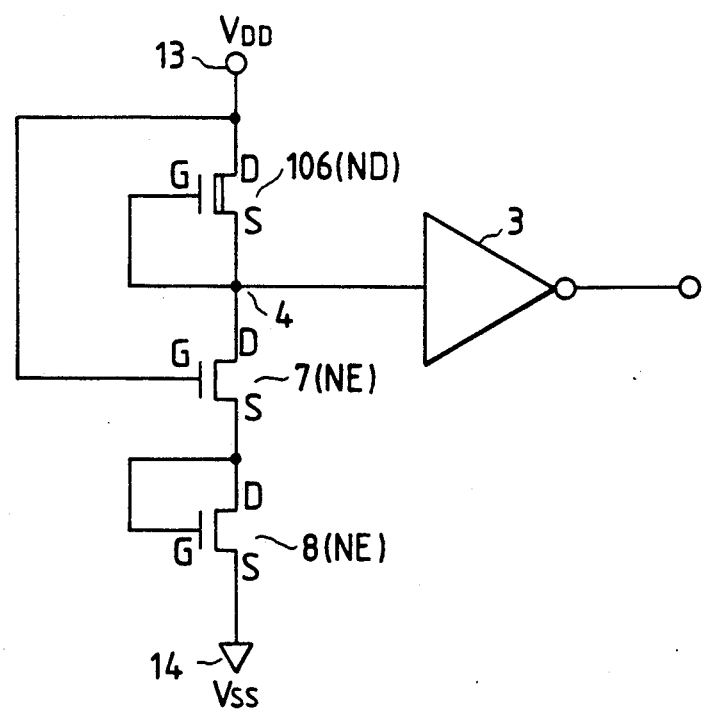
FIG. 6 is a circuit diagram showing a power-on reset circuit according to the second embodiment of the present invention.

FIG. 6 is a circuit diagram showing a power-on reset circuit according to the second embodiment of the present invention. The power-on reset circuit of the second embodiment is different from that of the FIG. 1 circuit in that an N-channel depletion (ND) type transistor 106 is employed instead of the P-channel enhancement (PE) type transistor 6, and that the gate G of the transistor 106 is connected to the node 4.

The operation of the power-on reset circuit is similar to that of the circuit of the first embodiment, and no further description of it will be given.

Figure 8:
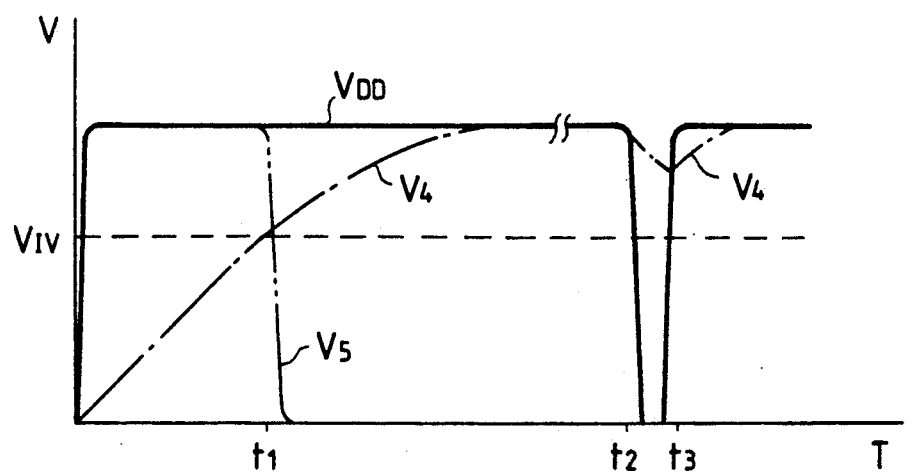
FIG. 8 is a graph useful in explaining the operation of the power-on reset circuit of FIG. 7.

When seeing the graphs of FIGS. 3 and 4, it appears to take a long time to detect the power voltage change. This is because the time axes are greatly enlarged in the graphs. However, the detection is actually performed within the extremely short time periods of the rise and fall as shown in FIG. 2. This will be explicitly understood when comparing with that of the FIG. 8 case.

The power-on reset circuit according to the present invention thus arranged have the following beneficial effects. The power-on reset circuit can be constructed with transistors, not using resistors and capacitors. Accordingly, when it is fabricated into the integrated circuit, the required area is small.

Further, the conventional power-on reset circuit utilizes a time constant circuit for the voltage change detection. A lapse of time depending on the time constant is essential, and the corresponding time must be taken before the power voltage change detection. In the present invention, on the other hand, the time constant circuit is not used, and time between the voltage change and its detection is extremely short. Therefore, an interrupt of the power source, if occurs, can readily be detected.

Moreover, since resistors and capacitors are not used, the power-on reset circuit of the invention is free from the problem of the variation in their values.

What is claimed is:

1. A power-on reset circuit system, comprising:
   means for generating a constant voltage, a voltage drop of which being limited to within a fixed value;
   a transistor means a source voltage of which being applied from said constant voltage generating means, a gate voltage of said transistor means being a power source voltage to be monitored;
   a current path forming element, connected to a drain of said transistor means, fed with current from said power source voltage; and
   an invertor having an input terminal connected between said current path forming element and said transistor means.

2. A power-on reset circuit comprising:
   a substrate;
   an input terminal for receiving a power source voltage;
   a first transistor means having a gate, source and drain, said source being connected to said input terminal, said gate being connected to said substrate;
   an invertor having an input terminal connected to said drain of said first transistor, an output of said invertor representing a state of said power source voltage;
   a second transistor means having a gate, source and drain, said gate being connected to said input terminal, said drain being connected to said drain of said first transistor means and to said input of said invertor;
   a third transistor means having a gate, source and drain, said drain being connected to said source of said second transistor means, said gate being connected to said source of said second transistor means, said source being connected to said substrate.

3. The power-on reset circuit of claim 2, wherein said first transistor means comprises an P-channel enhancement type transistor, and said second and third transistor means comprise an N-channel enhancement type transistor.

4. The power-on reset circuit of claim 3, further comprising:
   a first stray capacitor connected between said input terminal and said input of said invertor;
   a second stray capacitor connected between said drain of said first transistor means and said substrate; and
   a third stray capacitor connected between said source of said second transistor means and said substrate.

5. A power-on reset circuit comprising:
   a substrate;
   a terminal for inputting a power source voltage;
   an invertor having an input terminal, an output of said invertor representing a state of said power source voltage;
   a first transistor means having a gate, source and drain, said drain being connected to said input terminal, said s gate and said source being connected to said input said invertor;
   a second transistor means having a gate, source and drain, said gate being connected to said input terminal, said drain being connected to said source of said first transistor means and input of said invertor;
   a third transistor means having a gate, source and drain, said drain being connected to said source of said second transistor means, said gate being connected to said source of said second transistor means, said source being connected to said substrate.

6. The power-on reset circuit of claim 5, wherein said first transistor means comprises an N-channel depletion type transistor, and said second and third transistor means comprises an N-channel enhancement type transistor.

* * * * *

UNITED STATES PATENT AND TRADEMARK OFFICE
CERTIFICATE OF CORRECTION

PATENT NO. : 5,103,115
DATED : April 07, 1992
INVENTOR(S) : Yutaka Ueda et al.

It is certified that error appears in the above-identified patent and that said Letters Patent is hereby corrected as shown below:

Claim 1, column 7, line 37, after "transistor means" insert -- , --.

Claim 5, column 8, line 38, delete "s".

Signed and Sealed this

Seventh Day of December, 1993

Attest:

BRUCE LEHMAN

Attesting Officer     Commissioner of Patents and Trademarks